(12) United States Patent
Hamada et al.

(10) Patent No.: US 9,716,006 B2
(45) Date of Patent: Jul. 25, 2017

(54) SEMICONDUCTOR DEVICE MANUFACTURING METHOD AND SEMICONDUCTOR DEVICE

(71) Applicant: Mitsubishi Electric Corporation, Chiyoda-ku (JP)

(72) Inventors: Kenji Hamada, Tokyo (JP); Naruhisa Miura, Tokyo (JP); Yosuke Nakanishi, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/316,905

(22) PCT Filed: Apr. 10, 2015

(86) PCT No.: PCT/JP2015/061199
§ 371 (c)(1),
(2) Date: Dec. 7, 2016

(87) PCT Pub. No.: WO2016/017215
PCT Pub. Date: Feb. 4, 2016

(65) Prior Publication Data
US 2017/0140934 A1 May 18, 2017

(30) Foreign Application Priority Data
Jul. 30, 2014 (JP) .................. 2014-154544

(51) Int. Cl.
*H01L 21/02* (2006.01)
*H01L 29/66* (2006.01)
(Continued)

(52) U.S. Cl.
CPC ........ *H01L 21/02694* (2013.01); *C30B 29/36* (2013.01); *C30B 31/185* (2013.01);
(Continued)

(58) Field of Classification Search
None
See application file for complete search history.

(56) References Cited

U.S. PATENT DOCUMENTS

| 2012/0241766 A1 | 9/2012 | Ohtsuka et al. |
| 2016/0189955 A1* | 6/2016 | Horii ............... H01L 21/046 |
| | | 257/77 |

(Continued)

FOREIGN PATENT DOCUMENTS

| JP | 60-121725 A | 6/1985 |
| JP | 61-97931 A | 5/1986 |

(Continued)

OTHER PUBLICATIONS

International Search Report issued Jun. 2, 2015 in PCT/JP2015/061199 filed Apr. 10, 2015.

*Primary Examiner* — Asok K Sarkar
(74) *Attorney, Agent, or Firm* — Oblon, McClelland, Maire & Neustadt, L.L.P.

(57) ABSTRACT

A method for manufacturing a semiconductor device, includes: (a) providing a SiC epitaxial substrate in which on a SiC support substrate, a SiC epitaxial growth layer having an impurity concentration equal to or less than $\frac{1}{10{,}000}$ of that of the SiC support substrate and having a thickness of 50 μm or more is disposed; (b) forming an impurity region, which forms a semiconductor element, on a first main surface of the SiC epitaxial substrate by selectively injecting impurity ions; (c) forming an ion implantation region, which controls warpage of the SiC epitaxial substrate, on a second main surface of the SiC epitaxial substrate by injecting predetermined ions; and (d) heating the SiC epitaxial substrate after (b) and (c).

11 Claims, 9 Drawing Sheets

(51) Int. Cl.
   *C30B 29/36*   (2006.01)
   *C30B 31/18*   (2006.01)
   *C30B 31/22*   (2006.01)
   *H01L 21/78*   (2006.01)
   *H01L 29/16*   (2006.01)
   *H01L 29/78*   (2006.01)
   *H01L 21/04*   (2006.01)

(52) U.S. Cl.
   CPC ........ *C30B 31/22* (2013.01); *H01L 21/02378* (2013.01); *H01L 21/02529* (2013.01); *H01L 21/0465* (2013.01); *H01L 21/7806* (2013.01); *H01L 29/1608* (2013.01); *H01L 29/66068* (2013.01); *H01L 29/7813* (2013.01)

(56) References Cited

U.S. PATENT DOCUMENTS

| | | | |
|---|---|---|---|
| 2016/0225624 A1* | 8/2016 | Horii | H01L 21/049 |
| 2016/0240380 A1* | 8/2016 | Horii | H01L 21/0455 |
| 2016/0293423 A1* | 10/2016 | Yamada | H01L 21/324 |
| 2016/0300910 A1* | 10/2016 | Kudou | H01L 29/1608 |
| 2016/0343808 A1* | 11/2016 | Ishibashi | H01L 29/32 |
| 2016/0359007 A1* | 12/2016 | Ishibashi | H01L 29/6606 |
| 2017/0076934 A1* | 3/2017 | Kubota | H01L 21/027 |

FOREIGN PATENT DOCUMENTS

| | | |
|---|---|---|
| JP | 2009-49219 A | 3/2009 |
| JP | 2011-100860 A | 5/2011 |
| WO | 2011/083552 A1 | 7/2011 |

\* cited by examiner

F I G. 1 0
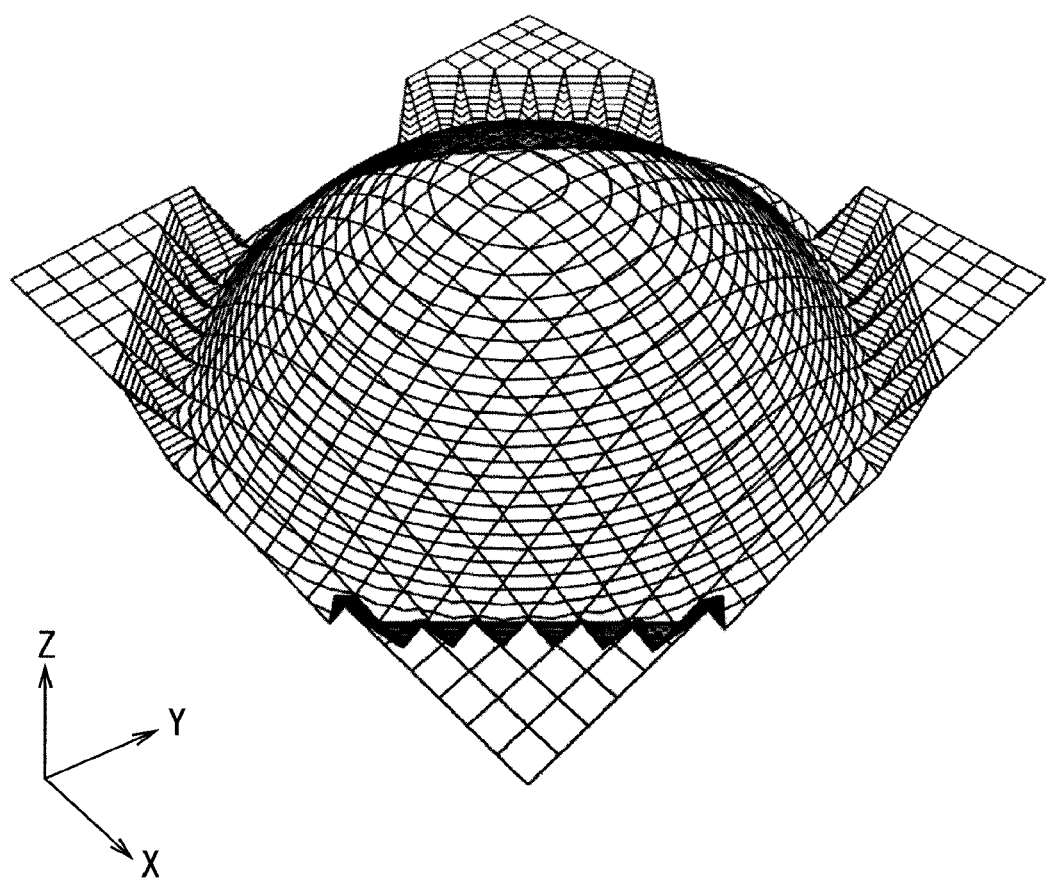

F I G. 1 1
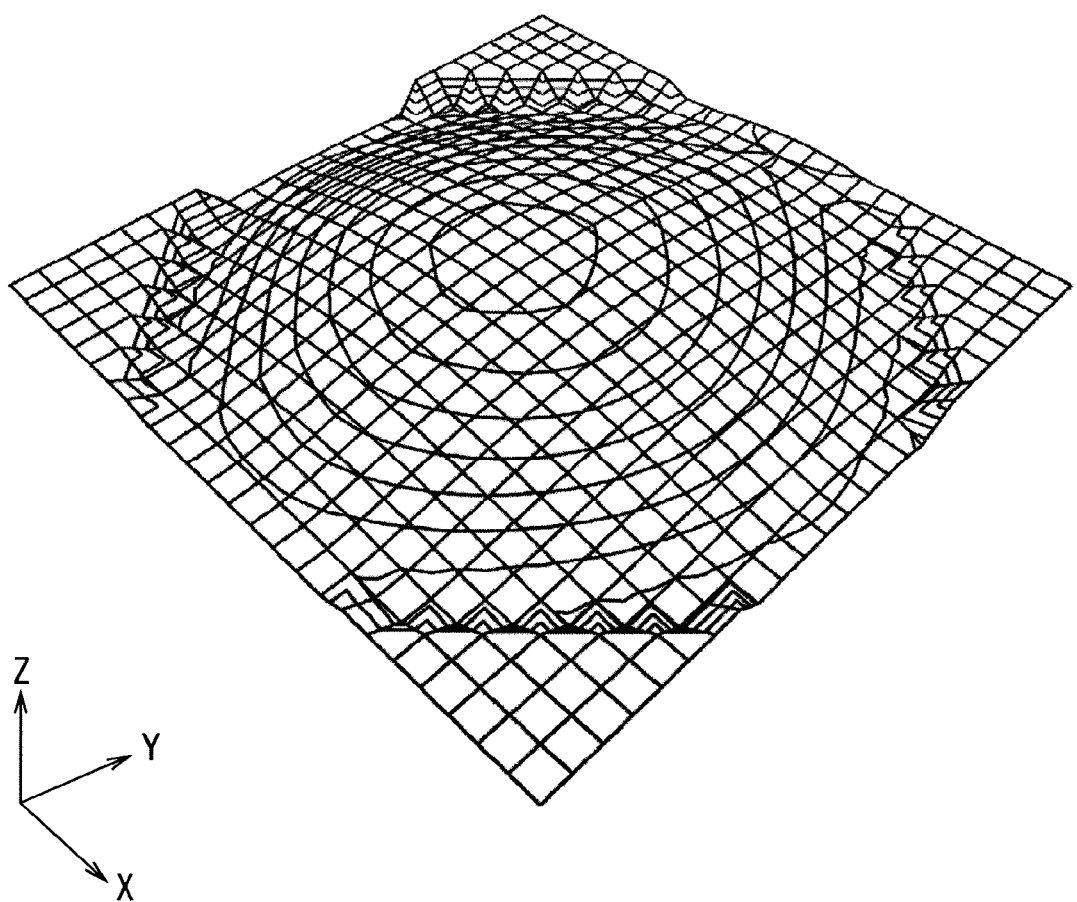

F I G. 2 1
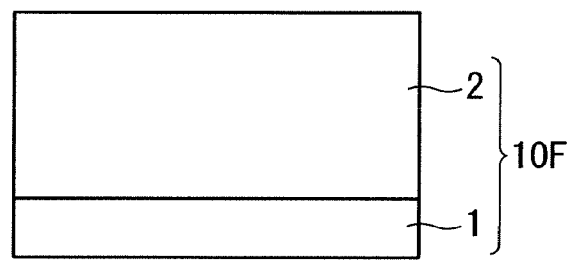

SEMICONDUCTOR DEVICE MANUFACTURING METHOD AND SEMICONDUCTOR DEVICE

TECHNICAL FIELD

The present invention relates to a method for manufacturing a semiconductor device, and particularly to a manufacturing method for stably manufacturing a silicon carbide semiconductor device.

BACKGROUND ART

In a semiconductor device with ultra-high breakdown voltage (a breakdown voltage of 10 kV or more), which is obtained using silicon carbide (SiC), a drift layer is designed to have a low impurity concentration and a large thickness to secure a breakdown voltage. The drift layer usually includes a SiC epitaxial growth layer formed on a SiC support substrate with a high impurity concentration by epitaxial growth, the SiC epitaxial growth layer having a low impurity concentration.

The impurity concentration of SiC is generally controlled by changing the doping concentration of nitrogen atoms when the conductivity-type is a n-type. The nitrogen atom can replace the carbon atom in its position in the SiC crystal, and act as a donor. The nitrogen atom has an atomic radius smaller than that of the carbon atom, and therefore when the SiC crystal is doped with nitrogen, the lattice constant decreases.

When a SiC epitaxial growth layer with a low impurity concentration is formed on a SiC support substrate with a high impurity concentration, a lattice mismatch occurs due to a difference in lattice constant between the SiC support substrate and the SiC epitaxial growth layer, so that large warpage occurs in a SiC epitaxial substrate including the SiC support substrate and the SiC epitaxial growth layer.

Specifically, due to compressive stress of the SiC epitaxial growth layer, the SiC epitaxial substrate is convexly warped so as to protrude toward the SiC epitaxial growth layer. When warpage of the SiC epitaxial substrate is large, the SiC epitaxial substrate may be cracked in a process for manufacturing a SiC semiconductor device, particularly in steps which give a heat shock through a heat treatment etc. Further, there is the problem that when the breakdown voltage of the SiC semiconductor device is to be made higher, a SiC epitaxial growth layer with a lower impurity concentration and a larger thickness is required, and therefore warpage of the SiC epitaxial substrate further increases.

It has been proposed that as disclosed in, for example, Patent Document 1, a buffer layer having a gradually inclined structure in which the impurity concentration is gradually changed or a continuously inclined structure in which the impurity concentration is continuously changed is provided between a SiC support substrate and a SiC epitaxial growth layer for reducing a lattice mismatch between the SiC support substrate and the SiC epitaxial growth layer.

Patent Document 2 discloses a technique in which in a group III nitride semiconductor substrate, the wrap of the substrate is reduced by implantation of ions from each of main surfaces of the substrate to form an ion implantation region having a predetermined depth on both main surface sides of the substrate.

However, with a method in which a buffer layer is provided between a SiC support substrate and a SiC epitaxial growth layer as in Patent Document 1, warpage after formation of the SiC epitaxial growth layer (before formation of a semiconductor element) is reduced, but warpage of the SiC epitaxial substrate, which occurs under semiconductor element formation conditions (e.g. ion implantation conditions), cannot be avoided.

With the method disclosed in Patent Document 2, i.e. a method in which an ion implantation region is formed on both main surfaces of a semiconductor substrate to control warpage of the substrate, warpage of the substrate before formation of a semiconductor element can be suppressed, but there is a doubt about whether warpage of the substrate after formation of the semiconductor element can be suppressed.

PRIOR ART DOCUMENTS

Patent Documents

Patent Document 1: International Publication No. WO 2011/083552

Patent Document 2: Japanese Patent Application Laid-Open No. 2011-100860

SUMMARY OF INVENTION

Problems to be Solved by the Invention

As described above, occurrence of warpage in a SiC epitaxial substrate due to a lattice mismatch between a SiC support substrate and a SiC epitaxial growth layer is not desirable, and a technique for suppressing warpage of the SiC epitaxial substrate is required. Particularly, when a semiconductor device with ultra-high breakdown voltage is manufactured, a SiC epitaxial growth layer which has an impurity concentration equal to or less than $1/10,000$ of that of a low-resistance SiC support substrate having a high impurity concentration and which has a thickness of 50 μm or more is used, and therefore warpage of the SiC epitaxial substrate is noticeable.

The present invention has been made for solving the above-described problems, and an object of the present invention is to provide a method for manufacturing a semiconductor device, which is capable of stably manufacturing a SiC semiconductor device by preventing a SiC epitaxial substrate from being cracked in a process for manufacturing the SiC semiconductor device.

Means for Solving the Problems

A method for manufacturing a semiconductor device according to the present invention includes: a step (a) of providing a SiC epitaxial substrate in which on a SiC support substrate, a SiC epitaxial growth layer having an impurity concentration equal to or less than $1/10,000$ of that of the SiC support substrate and having a thickness of 50 μm or more is disposed; a step (b) of forming an impurity region, which forms a semiconductor element, on a first main surface of the SiC epitaxial substrate by selectively implanting impurity ions; a step (c) of forming an ion implantation region, which controls warpage of the SiC epitaxial substrate, on a second main surface of the SiC epitaxial substrate by implanting predetermined ions; and a step (d) of heating the SiC epitaxial substrate after the step (b) and the step (c).

Effects of the Invention

A method for manufacturing a semiconductor device according to the present invention includes the step of forming an ion implantation region which controls warpage of a SiC epitaxial substrate, and thus warpage of the SiC epitaxial substrate, which is caused by a lattice mismatch between a SiC support substrate and a SiC epitaxial growth layer, is suppressed, so that an almost flat SiC epitaxial substrate can be obtained. Accordingly, even when a subsequent heat treatment is performed, the SiC epitaxial substrate is not cracked, and thus a SiC semiconductor device can be stably obtained. Since ion implantation for controlling warpage of the SiC epitaxial substrate is applied to a surface of the SiC epitaxial substrate on a side opposite to the first main surface, optimum implantation conditions for controlling warpage can be selected without considering conditions for formation of a semiconductor element on the first main surface of the SiC epitaxial substrate, and the thickness and impurity concentration of the SiC epitaxial growth layer.

BRIEF DESCRIPTION OF DRAWINGS

FIG. 10 is a perspective view showing a change in shape of the SiC epitaxial substrate in a wafer state.

FIG. 11 is a perspective view showing a change in shape of the SiC epitaxial substrate in a wafer state.

FIG. 21 is a sectional view explaining a method for manufacturing a semiconductor device in embodiment 6 according to the present invention.

DESCRIPTION OF EMBODIMENTS (Embodiment 1)

Figure 1:
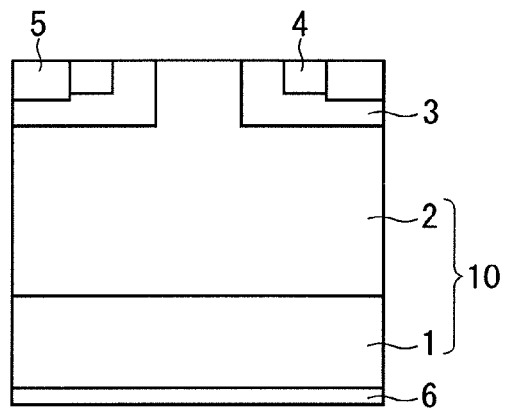
FIG. 1 is a sectional view showing a configuration of SiC-MOSFET formed by a method for manufacturing a semiconductor device in embodiment 1 according to the present invention.

FIG. 1 is a sectional view showing a configuration of SiC-MOSFET (Metal-Oxide-Semiconductor Field Effect Transistor) 100 formed by a method for manufacturing a semiconductor device in embodiment 1 according to the present invention. For the conductivity-type of impurities, the n-type is defined as a "first-conductivity-type" and the p-type is defined as a "second-conductivity-type" in the descriptions below, but the conductivity-type of impurities may be inversely defined.

(Device Configuration)

As shown in FIG. 1, SiC-MOSFET 100 is formed on a SiC epitaxial substrate 10 in which a SiC epitaxial growth layer 2 of first-conductivity-type is disposed on the Si atomic plane or the C atomic plane of a SiC support substrate 1 of first-conductivity-type (n-type).

Specifically, a plurality of well regions 3 of second-conductivity-type (p-type) are selectively disposed on the upper layer part of the SiC epitaxial growth layer 2 of the SiC epitaxial substrate 10, a well contact region 5 of second-conductivity-type is disposed in the surface of each well region 3, and a source region 4 of first-conductivity-type is disposed so as to surround the well contact region 5. An ion implantation region 6 is disposed on a main surface of the SiC support substrate 1 on a side opposite to the surface on which the SiC epitaxial growth layer 2 is disposed.

Figure 2:
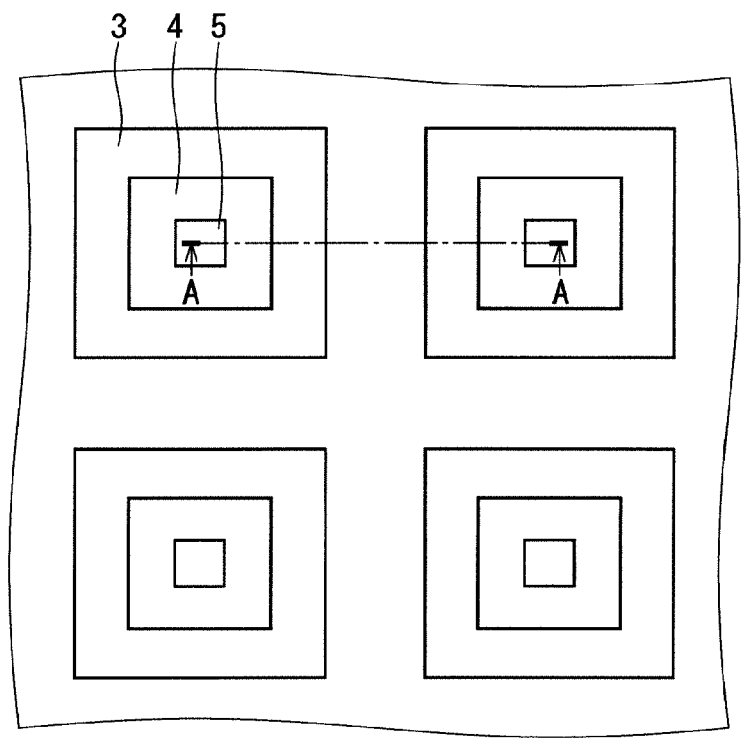
FIG. 2 is a view showing a shape in plan view of SiC-MOSFET formed by the method for manufacturing a semiconductor device in embodiment 1 according to the present invention.

A shape of SiC-MOSFET 100 in plan view will now be described using FIG. 2. FIG. 2 is a plan view of SiC-MOSFET 100 seen from the well region 3 side, and as shown in FIG. 2, the source region 4 surrounds the periphery of the well contact region 5 having a substantially tetragonal outer shape, and further, the outer periphery of the source region 4 is surrounded by the well region 3.

A gate insulating film provided so as to extend from the top of a part of the source region 4 to the top of the well region 3 and from the top of the SiC epitaxial growth layer 2 to the top of a part of the source region 4 of the adjacent well region 3 between adjacent well regions 3, a gate electrode provided so as to cover the top of the gate insulating film, a drain electrode formed on the SiC support substrate 1, and so on are not illustrated. FIG. 1 corresponds to a cross-section taken along line A-A in FIG. 2.

(Manufacturing Method)

A method for manufacturing a semiconductor device in embodiment 1 according to the present invention will now be described with reference to FIGS. 3 to 5 which are sectional views explaining manufacturing steps in order.

Figure 3:
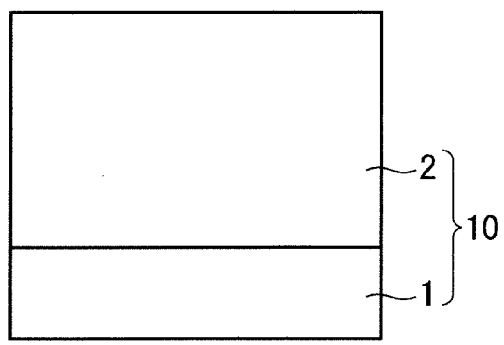
FIG. 3 is a sectional view explaining the method for manufacturing a semiconductor device in embodiment 1 according to the present invention.

First, in the step shown in FIG. 3, the SiC epitaxial growth layer 2 of first-conductivity-type is formed by epitaxial growth on the Si atomic plane or C atomic plane of the SiC support substrate 1 of first-conductivity-type to obtain the SiC epitaxial substrate 10. This step is referred to as a step of providing a SiC epitaxial substrate.

The impurity concentration of the SiC epitaxial growth layer 2 is lower than the impurity concentration of the SiC support substrate 1, and for example, when the impurity concentration of the SiC support substrate 1 is $1\times10^{19}$ cm$^{-3}$, the impurity concentration of the SiC epitaxial growth layer 2 is $1\times10^{14}$ cm$^{-3}$. As a dopant for the SiC support substrate 1 and the SiC epitaxial growth layer 2, nitrogen is used when the conductivity-type is controlled to a n-type, and aluminum is used when the conductivity-type is controlled to a p-type.

The impurity concentration of the SiC support substrate 1 is preferably in the range of $1\times10^{17}$ cm$^{-3}$ to $1\times10^{21}$ cm$^{-3}$, and the impurity concentration of the SiC epitaxial growth layer 2 is preferably in the range of $1\times10^{13}$ cm$^{-3}$ to $1\times10^{16}$ cm$^{-3}$. The thickness of the SiC epitaxial growth layer 2 is preferably 50 µm to 500 µm. Due to compressive stress of the SIC epitaxial growth layer 2, the SiC epitaxial substrate 10 is inevitably warped so as to protrude toward the SiC epitaxial growth layer 2.

Figure 4:
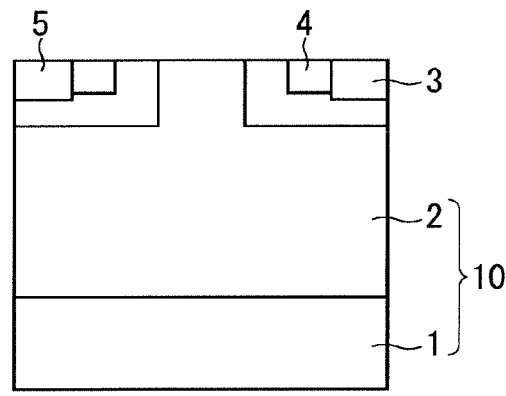
FIG. 4 is a sectional view explaining the method for manufacturing a semiconductor device in embodiment 1 according to the present invention.

Next, selective ion implantation is applied to a main surface (first main surface) of the SiC epitaxial substrate 10 on the SiC epitaxial growth layer 2 side to form the well region 3 of second-conductivity-type, the source region 4 of first-conductivity-type and the well contact region 5 of second-conductivity-type on the upper layer part of the SiC epitaxial growth layer 2 as shown in FIG. 4.

More specifically, a plurality of well regions 3 are selectively formed by applying ion implantation of a second-conductivity-type (p-type) impurity to the upper layer part of the SiC epitaxial growth layer 2 through an implantation mask patterned in a predetermined shape.

Next, the source region 4 is selectively formed by applying ion implantation of a first-conductivity-type (n-type) impurity in the surface of each well region 3 through an implantation mask patterned in a predetermined shape.

Further, the well contact region 5 is selectively formed by applying ion implantation of a second-conductivity-type impurity to each source region 4 through an implantation mask patterned in a predetermined shape.

As the implantation mask, for example, a photoresist for photolithography process, or a silicon oxide film can be used.

The order of forming the well region 3, the source region 4 and the well contact region 5 is not limited to the above order.

The ion implantation may be performed with single implantation energy, or may be performed with implantation energy changed gradually, for example from high energy to low energy.

Nitrogen or phosphorus is used as the first-conductivity-type impurity to be ion-implanted, aluminum or boron is used as the second-conductivity-type impurity, the implantation surface density (dose) of implantation ions during ion implantation is preferably within the range of $1\times10^{13}$ cm$^{-2}$ to $1\times10^{16}$ cm$^{-2}$, and the implantation energy is preferably within the range of 10 keV to 10 MeV.

For example, the impurity concentrations of the well region 3, the source region 4 and the well contact region 5 are preferably within the range of $1\times10^{17}$ cm$^{-3}$ to $1\times10^{19}$ cm$^{-3}$, $1\times10^{18}$ cm$^{-3}$ to $1\times10^{20}$ cm$^{-3}$ and $1\times10^{19}$ cm$^{-3}$ to $1\times10^{21}$ cm$^{-3}$, respectively.

The depths of the well region 3, the source region 4 and the well contact region 5 are preferably within the range of 0.5 to 3 µm, 0.2 to 1 µm and 0.2 µm to 1 µm, respectively.

In the ion implantation, the temperature of the SiC epitaxial substrate is set within the range of 10° C. to 1000° C. Accordingly, such an effect that crystal defects (implantation defects) generated during ion implantation can be recovered to a certain degree is obtained.

Figure 5:
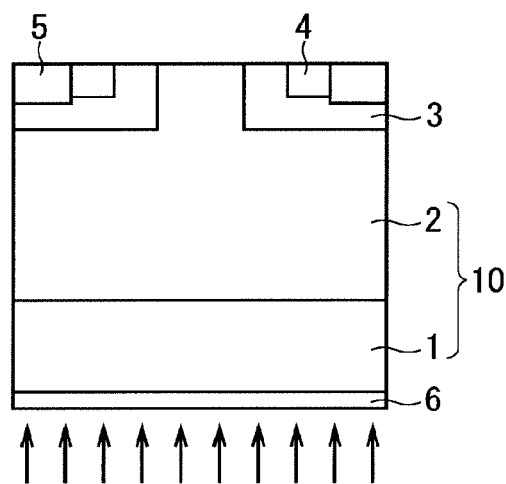
FIG. 5 is a sectional view explaining the method for manufacturing a semiconductor device in embodiment 1 according to the present invention.

Subsequently, ion implantation is applied to a main surface (second main surface) of the SiC epitaxial substrate 10 on the SiC support substrate 1 side to form the ion implantation region 6 on the whole main surface of the SiC support substrate 1 as shown in FIG. 5. The ion implantation may be performed with single implantation energy, or may be performed with implantation energy changed gradually, for example from high energy to low energy.

The implantation surface density (dose) of implantation ions during ion implantation is preferably within the range of $1\times10^{13}$ cm$^{-2}$ to $1\times10^{16}$ cm$^{-2}$, and the implantation energy is preferably within the range of 10 keV to 10 MeV. When ion implantation is performed under the above-mentioned conditions, the concentration of the implanted element in the ion implantation region 6 is higher by one digit or more than in other regions in the SiC support substrate 1.

In the ion implantation, the temperature of the SiC epitaxial substrate is set within the range of 10° C. to 1000° C. Accordingly, such an effect that crystal defects (implantation defects) generated during ion implantation can be recovered to a certain degree is obtained.

The thickness of the ion implantation region 6 is preferably within the range of 0.1 µm to 10 µm, and the element to be used for the ion implantation is preferably an element serving as a non-dopant that is inert to SiC, such as carbon, silicon, hydrogen, helium or argon, but a dopant such as aluminum, boron, phosphorus or nitrogen can also be used.

Specifically, an element with a conductivity-type identical to that of the SiC support substrate 1 of first-conductivity-type (n-type), for example a n-type dopant such as phosphorus or nitrogen, can also be used, and in this case, the impurity concentration of the ion implantation region 6 may be equal to or higher than the impurity concentration of the SiC support substrate 1. Accordingly, the contact resistance in formation of a metal electrode on the second main surface of the SiC epitaxial substrate 10 can be reduced.

On the other hand, an element with a conductivity-type (p-type) opposite to that of the SiC support substrate 1 of first-conductivity-type (n-type), for example a p-type dopant such as aluminum or boron, can also be used, and in this case, the impurity concentration of the ion implantation region 6 may be equal to or higher than the impurity concentration of the SiC support substrate 1. Accordingly, the ion implantation region 6 can be used as a collector layer in SiC-IGBT (Insulated Gate Bipolar Transistor). When this configuration is employed, SiC-IGBT is obtained rather than SiC-MOSFET, and the configuration is effective when SiC-IGBT is manufactured.

Generally, when ions are implanted into a crystal substance, an implantation layer is cubically expanded due to the impurity atom packing effect and irradiation defect generation. Cubic expansion is restrained by the substrate, and resultantly, compressive stress is induced parallel to the ion implantation surface. This phenomenon is irrelevant to the kind of implantation ions, and when a dopant is implanted, the conductivity-type controlling effect and contact resistance reducing effect are obtained at a time, but it is preferable to implant a non-dopant when the purpose is merely to suppress warpage of the substrate.

Finally, the SiC epitaxial substrate 10 is heat-treated to activate implantation ions, so that SiC-MOSFET 100 shown in FIG. 1 is obtained. Here, the heating temperature of the SiC epitaxial substrate 10 is preferably within the range of 1000° C. to 2000° C., more preferably within the range of 1400° C. to 1800° C.

Since the SiC epitaxial substrate 10 is heat-treated (activation-annealed) after ion implantation to the first main surface of the SiC epitaxial substrate 10 for formation of impurity regions such as the well region 3, the source region 4 and the well contact region 5 and ion implantation to the second main surface for controlling warpage of the SiC epitaxial substrate 10 are performed, warpage of the SiC epitaxial substrate 10 is suppressed, so that the almost flat SiC epitaxial substrate 10 is obtained.

Since ion implantation for controlling warpage is applied to the second main surface of the SiC epitaxial substrate 10, which is on a side opposite to the first main surface, optimum implantation conditions for controlling warpage can be selected without considering conditions for formation of a semiconductor element on the first main surface of the SiC epitaxial substrate 10 (e.g. ion implantation conditions), and the thickness and impurity concentration of the SiC epitaxial growth layer 2. Thereafter, warpage of the SiC epitaxial substrate, which occurs due to a lattice mismatch between the SiC support substrate and the SiC epitaxial growth layer, is suppressed, and warpage of the SiC epitaxial substrate, which occurs through the step of forming the impurity region that forms a semiconductor element, is suppressed.

As a result, the almost flat SiC epitaxial substrate 10 is obtained, and therefore even when a heat treatment is subsequently performed to give a heat shock, the SiC epitaxial substrate 10 is not cracked, and thus a SiC semiconductor device can be stably manufactured.

Figure 6:
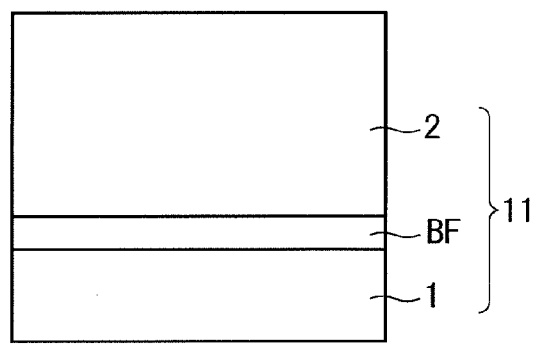
FIG. 6 is a sectional view showing a SiC epitaxial substrate provided with a buffer layer.

In the SiC epitaxial substrate 10 shown in FIG. 3, the SiC support substrate 1 and the SiC epitaxial growth layer 2 are in direct contact with each other, but the SiC epitaxial substrate may be replaced by a SiC epitaxial substrate 11 in which a buffer layer BF of first-conductivity-type is provided between the SiC support substrate 1 and the SiC epitaxial growth layer 2 as shown in FIG. 6. The buffer layer is a layer that reduces a difference in carrier concentration between the epitaxial layer and the substrate, and the thickness is set to about 0.5 to 10 μm (500 nm to 10000 nm).

(Modification 1)

A metal such as nickel may be used as an ion implantation element for the ion implantation region 6. In this case, by heat-treating the SiC epitaxial substrate 10 at a temperature within the range of 1000° C. to 2000° C., more preferably within the range of 1400° C. to 1800° C., implantation ions for the impurity region are activated, and the ion implantation region 6 is formed into a nickel silicide layer 16.

Figure 7:
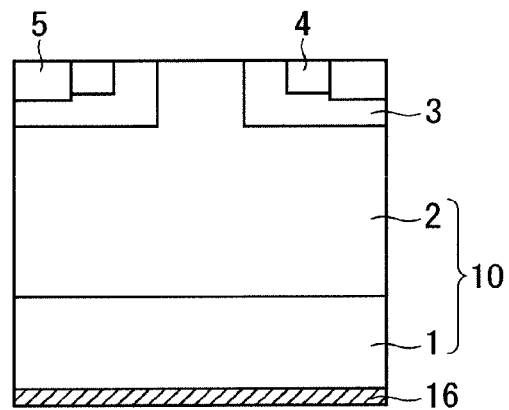
FIG. 7 is a sectional view explaining a modification of the method for manufacturing a semiconductor device in embodiment 1 according to the present invention.

FIG. 7 shows SiC-MOSFET 100A in which the nickel silicide layer 16 is formed on a main surface of the SiC support substrate 1 on a side opposite to the surface on which the SiC epitaxial growth layer 2 is disposed.

By providing the nickel silicide layer 16 as described above, warpage of the SiC epitaxial substrate 10 is suppressed, and the contact resistance with the metal electrode in formation of the metal electrode on the second main surface of the SiC epitaxial substrate 10 can be reduced.

A group IV element such as germanium may be used as an ion implantation element. Here, in the ion implantation region 6, the band gap is smaller as compared to SiC, and therefore the contact resistance between the second main surface of the SiC epitaxial substrate 10 and the metal electrode can be reduced.

(Modification 2)

In embodiment 1 described above, the ion implantation region 6 is formed on the whole second main surface of the SiC epitaxial substrate 10, but the ion implantation may be selectively performed through an implantation mask. As the implantation mask, for example, a photoresist for photolithography process, or a silicon oxide film can be used.

Figure 8:
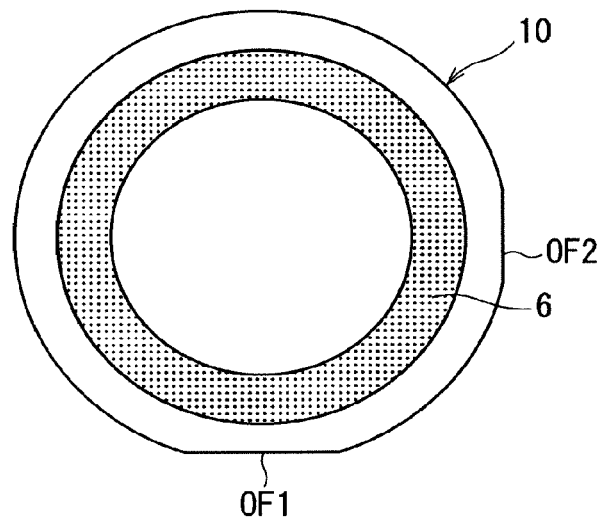
FIG. 8 is a plan view explaining a modification of the method for manufacturing a semiconductor device in embodiment 1 according to the present invention.

FIG. 8 shows a configuration in which the ion implantation region 6 is formed on the second main surface in such a manner that the shape in plan view is a ring shape as one example of selective ion implantation.

Specifically, FIG. 8 shows a plan view of the SiC epitaxial substrate 10 in a wafer state which is seen from the second main surface side, where the ion implantation region 6 is formed in a ring shape on the SiC support substrate 1.

Figure 9:
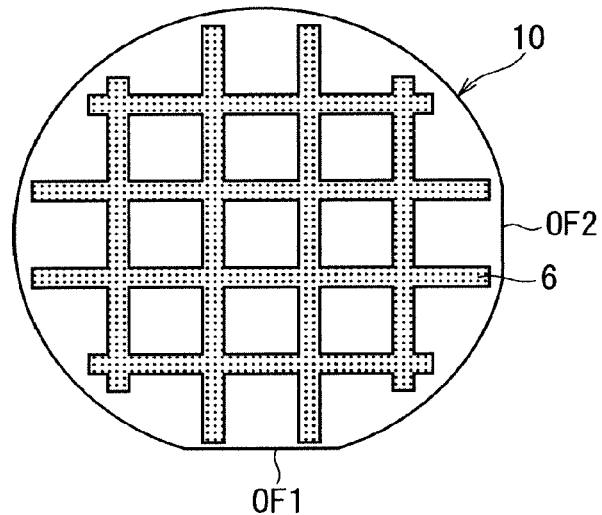
FIG. 9 is a plan view explaining a modification of the method for manufacturing a semiconductor device in embodiment 1 according to the present invention.

The ion implantation region 6 may be formed on the second main surface in such a manner that the shape in plan view is a lattice shape as shown in FIG. 9.

Specifically, FIG. 9 shows a plan view of the SiC epitaxial substrate 10 in a wafer state which is seen from the second main surface side, where the ion implantation region 6 is formed in a lattice shape on the SiC support substrate 1.

When the ion implantation region 6 is selectively formed in such a manner that the shape in plan view is a geometric shape as described above, there is a difference in compressive stress between an ion-implanted region and a non-ion-implanted region, so that warpage of the SiC epitaxial substrate 10 can be controlled. The shape of the ion implantation region 6 in plan view may be determined according to the state of warpage caused by ion implantation to the first main surface.

As shown in FIG. 8 and FIG. 9, orientation flats OF1 and OF2 as marks showing the orientation of the crystal are provided on the side surface of the SiC epitaxial substrate 10 in a wafer state, and both the orientation flats are provided so as to have such a positional relation that an angle of 90° is formed.

Specifically, the SiC epitaxial substrate 10 has the orientation flat OF1 parallel to the (11-20) direction, and the orientation flat OF2 intersecting the (11-20) direction and having a length different from that of the orientation flat OF1.

By using these orientation flats OF1 and OF2, a directivity in selective formation of the ion implantation region 6 can be determined, and the ion implantation region 6 having such a shape in plan view that warpage of the SiC epitaxial substrate 10 can be more effectively prevented can be formed. The shape of the ion implantation region 6 in plan view is not limited to the above shape, and may be a more complicated geometric shape.

When the ion implantation region 6 is selectively formed, the purpose is only suppression of warpage of the SiC epitaxial substrate 10, and it is preferable to remove the whole ion implantation region 6 after activation annealing is performed either when the ion implantation region 6 is formed using a non-dopant or when the ion implantation region 6 is formed using a dopant.

(Modification 3)

In embodiment 1 described above, the impurity concentration of the ion implantation region 6 is uniform over the whole second main surface of the SiC epitaxial substrate 10, but the impurity concentration of the ion implantation region 6 may be varied in the second main surface.

When for example, a region satisfying r=0 to 0.5 R is an "inner peripheral region" and the other region is an "outer peripheral region" where R is a radius of the SiC epitaxial substrate 10 and r (r<R) is a distance from the center of the SiC epitaxial substrate 10, the impurity concentration may be made relatively high in the outer peripheral region, and relatively low in the inner peripheral region, or inversely, the impurity concentration may be made relatively low in the outer peripheral region, and relatively high in the inner peripheral region.

Accordingly, there is a difference in compressive stress between the inner peripheral region and the outer peripheral region, so that warpage of the SiC epitaxial substrate 10 can be controlled. Whether the impurity concentration is made high or low in the outer peripheral region may be determined according to the state of warpage caused by ion implantation to the first main surface.

In embodiment 1 described above, the depth of the ion implantation region 6 is uniform over the whole second main surface of the SiC epitaxial substrate, but the depth of the ion implantation region 6 may be varied over the whole second main surface of the SiC epitaxial substrate.

For example, the depth of the ion implantation region 6 may be made relatively large in the outer peripheral region, and relatively small in the inner peripheral region of the SiC epitaxial substrate 10, or inversely, the depth of the ion implantation region 6 may be made relatively small in the outer peripheral region, and relatively large in the inner peripheral region of the SiC epitaxial substrate 10.

Accordingly, there is a difference in compressive stress between the inner peripheral region and the outer peripheral region, so that warpage of the SiC epitaxial substrate 10 can be controlled. Whether the depth of the ion implantation region 6 is made small or large in the outer peripheral region may be determined according to the state of warpage caused by ion implantation to the first main surface.

(Effect)

A change in shape of the SiC epitaxial substrate 11 in a wafer state (FIG. 6) in conducting the experiment of controlling warpage of a 3-inch SiC epitaxial substrate using the method for manufacturing a semiconductor device according to embodiment 1 described above will be described with reference to FIGS. 10 to 12.

In conducting this experiment, the impurity concentration of the SiC support substrate 1 was set to $1 \times 10^{19}$ cm$^{-3}$ and the impurity concentration of the SiC epitaxial growth layer 2 was set to $5 \times 10^{14}$ cm$^{-3}$ in the SiC epitaxial substrate 11. The thickness of the SiC epitaxial growth layer 2 was 142 µm.

The buffer layer BF between the SiC support substrate 1 and the SiC epitaxial growth layer 2 had an impurity concentration of $1 \times 10^{18}$ cm$^{-3}$ and a thickness of 1 µm. The conductivity-type of each of the SiC support substrate 1, the SiC epitaxial growth layer 2 and the buffer layer BF was a n-type.

The wafer shape of the SiC epitaxial substrate 11 is shown in FIG. 10. As shown in FIG. 10, the SiC epitaxial substrate 11 had a convex shape with respect to the Si atomic plane, and had a SORI of 9.3 µM.

Here, the "SORI" is a difference between the maximum value and the minimum value of the distance between the best fit reference plane (plane calculated by the least square method) of the wafer surface and the wafer surface in a wafer in a non-adsorbed state. Thereafter, ion implantation for formation of a semiconductor element was applied to the first main surface of the SiC epitaxial substrate 11. For the ion implantation for formation of a semiconductor element, aluminum was used as a p-type impurity, and nitrogen was used as a n-type impurity.

The wafer shape after performing the ion implantation for formation of a semiconductor element is shown in FIG. 11. In the wafer shape after performing ion implantation for formation of a semiconductor element, protrusion with respect to the Si atomic plane was more noticeable as shown in FIG. 11, and the SORI increased to 27.4 µm. The reason why ion implantation causes an increase in SORI may be that compressive stress is generated by ion implantation.

Thereafter, the ion implantation region 6 for controlling warpage of the SiC epitaxial substrate 11 was formed over the whole second main surface of the SiC epitaxial substrate 11. Carbon was used as an element for the ion implantation. The implantation surface density in the ion implantation was set to $5 \times 10^{15}$ cm$^{-2}$, and the temperature of the SiC epitaxial substrate 11 was set to 600° C.

Figure 12:
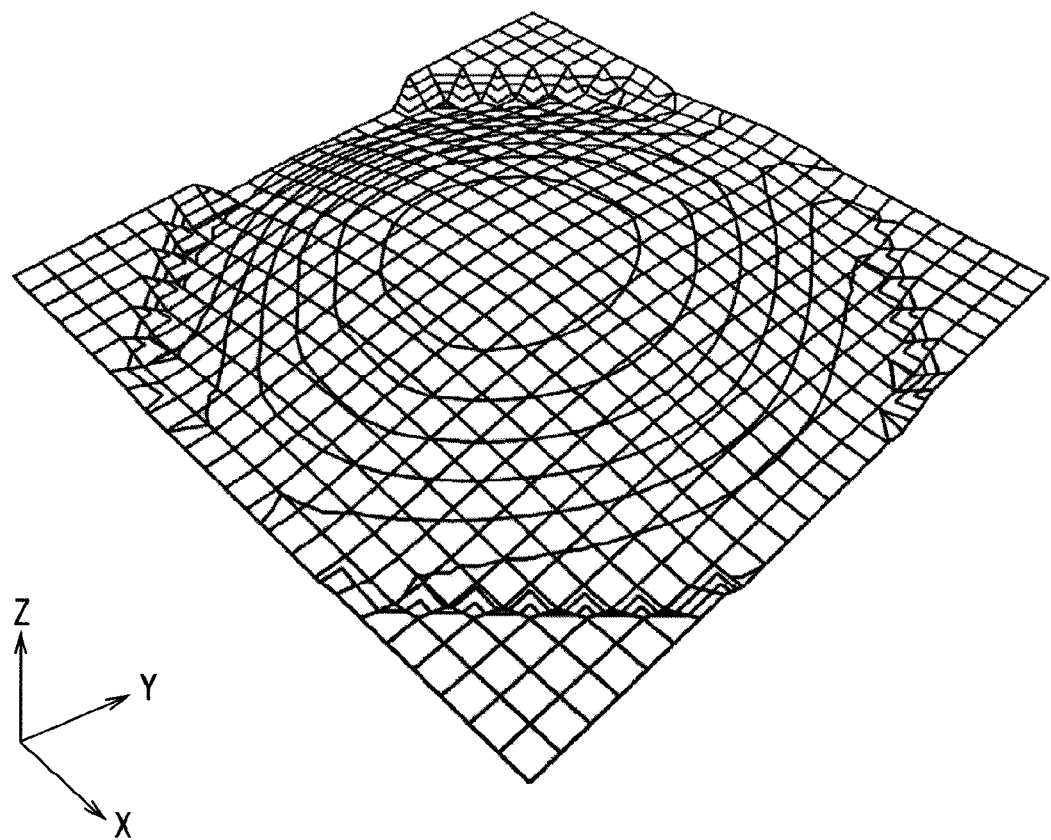
FIG. 12 is a perspective view showing a change in shape of the SiC epitaxial substrate in a wafer state.

The wafer shape after formation of the ion implantation region 6 is shown in FIG. 12. As shown in FIG. 12, the wafer shape after formation of the ion implantation region 6 was a convex shape with respect to the Si atomic plane, but the SORT decreased to 8.7 µm. This may be ascribable to compressive stress generated by the ion implantation region 6 formed over the whole second main surface of the SiC epitaxial substrate 11.

Thereafter, the SiC epitaxial substrate 11 shown in FIG. 12 was heat-treated at 1700° C. in an inert atmosphere for activation of implantation ions, but the SiC epitaxial substrate 11 was not cracked.

On the other hand, when the SiC epitaxial substrate 11 shown in FIG. 11 was similarly heat-treated without performing ion implantation for controlling warpage of the SiC epitaxial substrate 11 for comparison, the SiC epitaxial substrate 11 was cracked.

The above experimental results demonstrate that for ensuring that the SiC epitaxial substrate is not cracked, and thus a SiC semiconductor device is stably manufactured, it is effective to obtain a flat SiC epitaxial substrate by applying ion implantation for controlling warpage to a main surface on a side opposite to a main surface on which a semiconductor element is formed. When the SORI is within the range of 0 µm to 10 µm, it may be able to prevent the SiC epitaxial substrate from being cracked in heat cycle.

(Embodiment 2)

Figure 13:
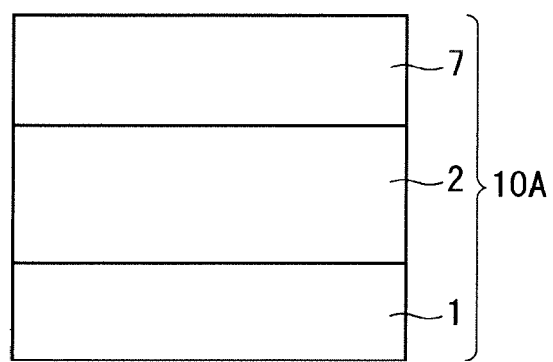
FIG. 13 is a sectional view explaining a method for manufacturing a semiconductor device in embodiment 2 according to the present invention.

While the SiC epitaxial substrate 10 in which the SiC epitaxial growth layer 2 of first-conductivity-type is disposed on the SiC support substrate 1 of first-conductivity-type is used in the method for manufacturing a semiconductor device in embodiment 1 described above, a SiC epitaxial substrate 10A in which an additional SiC epitaxial growth layer 7 of first-conductivity-type is further disposed on a SiC epitaxial growth layer 2 in a SiC epitaxial substrate 10 as shown in FIG. 13 is used in a method for manufacturing a semiconductor device in embodiment 2 according to the present invention.

The impurity concentration of the additional SiC epitaxial growth layer 7 is preferably lower than the impurity concentration of a SiC support substrate 1, and higher than the impurity concentration of the SiC epitaxial growth layer 2. For example, the impurity concentration of the additional SiC epitaxial growth layer 7 is preferably in the range of $1 \times 10^{16}$ cm$^{-3}$ to $1 \times 10^{18}$ cm$^{-3}$.

The depth of the additional SiC epitaxial growth layer 7 is preferably in the range of 0.5 µM to 5 µm.

Thereafter, selective ion implantation for formation of a semiconductor element is applied to a main surface (first main surface) of the SiC epitaxial substrate 10A on the additional SiC epitaxial growth layer 7 side, ion implantation for control of warpage of the substrate is applied to a main surface (second main surface) of the SiC epitaxial substrate 10A on the SiC support substrate 1 side, and a heat treatment is performed for activation of impurities, but since these manufacturing steps are the same as in embodiment 1, descriptions thereof are omitted.

In the method for manufacturing a semiconductor device according to embodiment 2 as described above, ion implantation for controlling warpage of the SiC epitaxial substrate 10A is applied to the second main surface of the SiC epitaxial substrate 10A, and therefore even after ion implantation for formation of a semiconductor element is performed, the almost flat SiC epitaxial substrate 10A is obtained, so that even when a heat treatment is subsequently performed to give a heat shock, the SiC epitaxial substrate 10A is not cracked, and thus a SiC semiconductor device can be stably manufactured.

The JFET (junction FET) resistance can be reduced by providing the SiC epitaxial growth layer 7. Specifically, when a switching semiconductor element such as an IGBT is prepared, for example, well regions of p-type are formed separately with respect to a first main surface of a SiC epitaxial substrate, but in a semiconductor device with ultra-high breakdown voltage (a breakdown voltage of 10 kV or more), the impurity concentration of a drift layer (SiC epitaxial growth layer) is set low, and therefore the resistance of a region (JFET region) sandwiched between the well regions markedly increases. Thus, by forming a layer (additional SiC epitaxial growth layer) having an impurity concentration higher than that of the drift layer, and forming a well region in the additional SiC epitaxial growth layer, the JFET resistance can be reduced. Since the additional SiC epitaxial growth layer has an impurity concentration higher than that of the drift layer, tensile stress is generated to contribute to reduction of warpage of the SiC epitaxial substrate.

Figure 14:
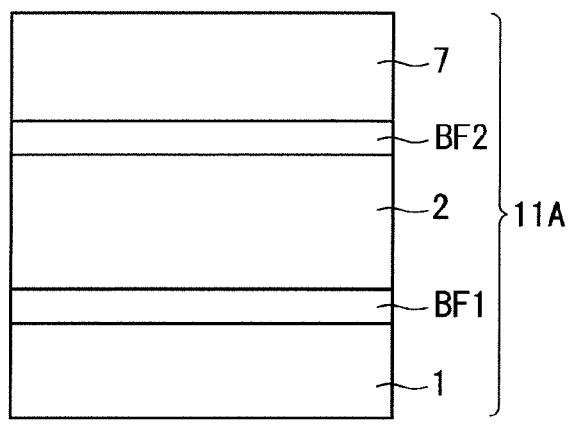
FIG. 14 is a sectional view showing a SiC epitaxial substrate provided with a buffer layer.

In the SiC epitaxial substrate 10A shown in FIG. 13, the SiC support substrate 1 and the SiC epitaxial growth layer 2 are in direct contact with each other, and the SiC epitaxial growth layer 2 and the additional SiC epitaxial growth layer 7 are in direct contact with each other, but the SiC epitaxial substrate may be replaced by a SiC epitaxial substrate 11A in which a buffer layer BF1 of first-conductivity-type is provided between the SiC support substrate 1 and the SiC epitaxial growth layer 2, and a buffer layer BF2 of first-conductivity-type is provided between the SiC epitaxial growth layer 2 and the additional SiC epitaxial growth layer 7 as shown in FIG. 14. The buffer layer is a layer that reduces a lattice mismatch due to a difference in carrier concentration between the epitaxial layer and the substrate, and the thickness is set to about 0.5 to 10 μm (500 nm to 10000 nm).

(Embodiment 3)

Figure 15:
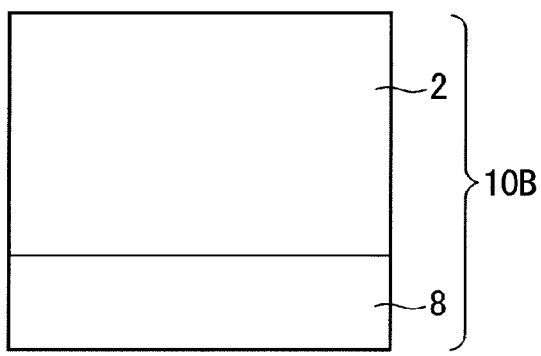
FIG. 15 is a sectional view explaining a method for manufacturing a semiconductor device in embodiment 3 according to the present invention.

While the SiC epitaxial substrate 10 in which the SiC epitaxial growth layer 2 of first-conductivity-type is disposed on the SiC support substrate 1 of first-conductivity-type is used in the method for manufacturing a semiconductor device in embodiment 1 described above, a SiC epitaxial substrate 10B in which a SiC epitaxial growth layer 2 of first-conductivity-type is disposed on a SiC support substrate 8 of second-conductivity-type as shown in FIG. 15 is used in a method for manufacturing a semiconductor device in embodiment 3 according to the present invention.

The impurity concentration of the SiC support substrate 8 is preferably in the range of $1 \times 10^{17}$ cm$^{-3}$ to $1 \times 10^{21}$ cm$^{-3}$, and SiC-IGBT with the SiC support substrate 8 as a collector layer can be obtained.

Thereafter, selective ion implantation for formation of a semiconductor element is applied to a main surface (first main surface) of the SiC epitaxial substrate 10B on the SiC epitaxial growth layer 2 side, ion implantation for control of warpage of the substrate is applied to a main surface (second main surface) of the SiC epitaxial substrate 10A on the SiC support substrate 1 side, and a heat treatment is performed for activation of impurities, but since these manufacturing steps are the same as in embodiment 1, descriptions thereof are omitted.

In the method for manufacturing a semiconductor device according to embodiment 3 as described above, ion implantation for controlling warpage of the SiC epitaxial substrate 10B is applied to the second main surface of the SiC epitaxial substrate 10B, and therefore even after ion implantation for formation of a semiconductor element is performed, the almost flat SiC epitaxial substrate 10B is obtained, so that even when a heat treatment is subsequently performed to give a heat shock, the SiC epitaxial substrate 10B is not cracked, and thus a SiC semiconductor device can be stably manufactured.

In embodiment 3, an additional SiC epitaxial growth layer 7 of first-conductivity-type may be further formed on the SiC epitaxial growth layer 2 as in the case of embodiment 2.

Figure 16:
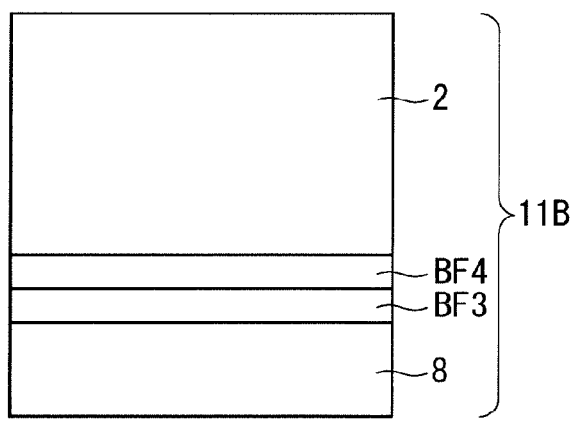
FIG. 16 is a sectional view showing a SiC epitaxial substrate provided with a buffer layer.

In the SiC epitaxial substrate 10B shown in FIG. 15, the SiC support substrate 8 and the SiC epitaxial growth layer 2 are in direct contact with each other, but the SiC epitaxial substrate may be replaced by a SiC epitaxial substrate 11B in which a buffer layer BF3 of second-conductivity-type and a buffer layer BF4 of first-conductivity-type are provided between the SiC support substrate 8 and the SiC epitaxial growth layer 2 as shown in FIG. 16. The buffer layer is a layer that reduces a lattice mismatch due to a difference in carrier concentration between the epitaxial layer and the substrate, and the thickness is set to about 0.5 to 10 μM (500 nm to 10000 nm).

(Embodiment 4)

Figure 17:
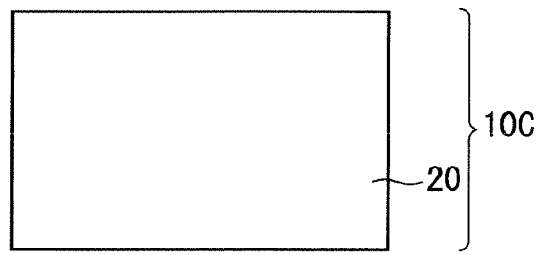
FIG. 17 is a sectional view explaining a method for manufacturing a semiconductor device in embodiment 4 according to the present invention.

While the SiC epitaxial substrate 10 in which the SiC epitaxial growth layer 2 of first-conductivity-type is disposed on the SiC support substrate 1 of first-conductivity-type is used in the method for manufacturing a semiconductor device in embodiment 1 described above, a SiC epitaxial substrate 10C including only a SiC epitaxial growth layer 2 of first-conductivity-type as shown in FIG. 17 is used in a method for manufacturing a semiconductor device in embodiment 4 according to the present invention.

The SiC epitaxial substrate 10C is obtained by removing the SiC support substrate 1 mechanically or chemically or by other method from the SiC epitaxial substrate 10 shown in FIG. 3. The SiC epitaxial substrate 10C including only an epitaxial growth layer as obtained in this manner is referred to as a "free-standing substrate (self-supported substrate)", and the step of providing a free-standing substrate is referred to as a step of providing a SiC epitaxial substrate.

Since the SiC epitaxial substrate 10C is a free-standing substrate, compressive stress on the SiC epitaxial growth layer 2 is not generated. Thus, warpage of the SiC epitaxial substrate 10C is smaller as compared to the SiC epitaxial substrates 10, 10A and 10B shown in FIG. 3, FIG. 13 and FIG. 15, respectively.

Thereafter, selective ion implantation for formation of a semiconductor element is applied to a main surface (first main surface) of the SiC epitaxial substrate 10C, ion implantation for control of warpage of the substrate is applied to the other main surface (second main surface) of the SiC epitaxial substrate 10C, and a heat treatment is performed for activation of impurities, but since these manufacturing steps are the same as in embodiment 1, descriptions thereof are omitted. The concentration of the implanted element in the ion implantation region for controlling warpage of the substrate is higher by one digit or more than in other regions in the SiC epitaxial growth layer 2.

When in formation of the ion implantation region for controlling warpage of the substrate, the element to be used for the ion implantation is carbon, the density of carrier traps in at least the region implanted with carbon is lower by one digit or more than in other regions in the SiC epitaxial growth layer 2. The principle thereof will be described below.

Carbon vacancy have been heretofore specified as electrically active defects (carrier traps) acting as a life time killer in the SiC crystal. Carbon is ion-implanted into the SiC crystal to additionally introduce interstitial carbon atoms in a region implanted with carbon, and further, the SiC crystal is heated to diffuse the additionally introduced interstitial carbon atoms into the deep part, so that carrier traps in the SiC crystal are electrically inactivated. Accordingly, the density of carrier traps in at least the region ion-implanted with carbon is lower by one digit or more than in other regions in the SiC epitaxial growth layer 2.

In the method for manufacturing a semiconductor device according to embodiment 4 as described above, ion implantation for controlling warpage of the SiC epitaxial substrate 10C is applied to the second main surface of the SiC epitaxial substrate 10C, and therefore even after ion implantation for formation of a semiconductor element is performed, the almost flat SiC epitaxial substrate 10C is obtained, so that even when a heat treatment is subsequently performed to give a heat shock, the SiC epitaxial substrate 10C is not cracked, and thus a SiC semiconductor device can be stably manufactured.

Thus, the manufacturing method in embodiment 4 is clearly different from the method disclosed in Patent Document 2, and in the heat treatment, the support substrate 1 does not exist, and the semiconductor substrate (SiC epitaxial substrate) itself is heat-treated.

With the SiC epitaxial substrate 10C, both semiconductor devices: SiC-MOSFET and SiC-IGBT can be prepared.

In embodiment 3, an additional SiC epitaxial growth layer 7 of first-conductivity-type may be further formed on the SiC epitaxial growth layer 2 as in the case of embodiment 2.

(Embodiment 5)

Figure 18:
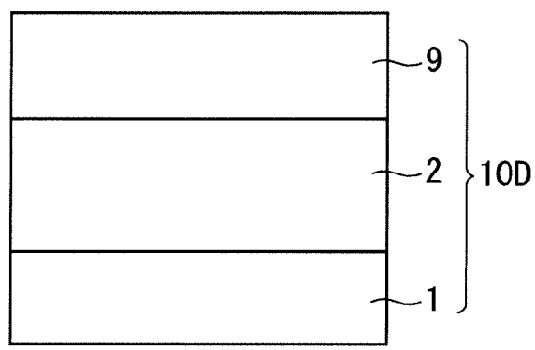
FIG. 18 is a sectional view explaining a method for manufacturing a semiconductor device in embodiment 5 according to the present invention.

While the SiC epitaxial substrate 10A in which the additional SiC epitaxial growth layer 7 of first-conductivity-type is further disposed on the SiC epitaxial growth layer 2 in the SiC epitaxial substrate 10 is used in the method for manufacturing a semiconductor device in embodiment 2 described above, a SiC epitaxial substrate 10D in which an additional SiC epitaxial growth layer 9 of second-conductivity-type is further disposed on a SiC epitaxial growth layer 2 in a SiC epitaxial substrate 10 as shown in FIG. 18 is used in a method for manufacturing a semiconductor device in embodiment 5 according to the present invention.

The impurity concentration of the additional SiC epitaxial growth layer 9 is preferably higher than the impurity concentration of the SiC epitaxial growth layer 2. For example, the impurity concentration of the additional SiC epitaxial growth layer 9 is preferably in the range of $1 \times 10^{16}$ cm$^{-3}$ to $1 \times 10^{21}$ cm$^{-3}$.

The thickness of the additional SiC epitaxial growth layer 9 is preferably in the range of 0.5 μm to 300 μm.

Figure 19:
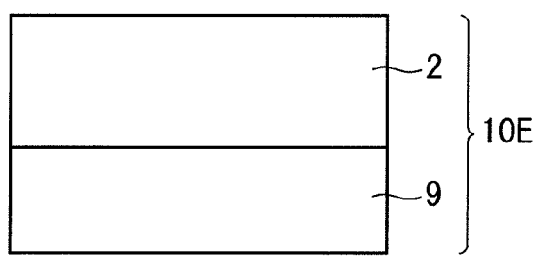
FIG. 19 is a sectional view explaining the method for manufacturing a semiconductor device in embodiment 5 according to the present invention.

Next, the SiC support substrate 1 is removed mechanically or chemically or by other method from the SiC epitaxial substrate 10D to form a SiC epitaxial substrate 10E including the additional SiC epitaxial growth layer 9 and the SiC epitaxial growth layer 2 as shown in FIG. 19.

In the SiC epitaxial substrate 10E, the first main surface is a main surface of the SiC epitaxial growth layer 2, and the second main surface is a main surface of the additional SiC epitaxial growth layer 9.

Thereafter, selective ion implantation for formation of a semiconductor element is applied to the first main surface of the SiC epitaxial substrate 10E, ion implantation for control of warpage of the substrate is applied to the second main surface of the SiC epitaxial substrate 10E, and a heat treatment is performed for activation of impurities, but since these manufacturing steps are the same as in embodiment 1, descriptions thereof are omitted.

In the method for manufacturing a semiconductor device according to embodiment 5 as described above, ion implantation for controlling warpage of the SiC epitaxial substrate 10E is applied to the second main surface of the SiC epitaxial substrate 10E, and therefore even after ion implantation for formation of a semiconductor element is performed, the almost flat SiC epitaxial substrate 10E is obtained, so that even when a heat treatment is subsequently performed to give a heat shock, the SiC epitaxial substrate 10E is not cracked, and thus a SiC semiconductor device can be stably manufactured.

The additional SiC epitaxial growth layer 9 has a conductivity-type opposite to that of the drift layer (SiC epitaxial growth layer 2), and therefore can be made to serve as a collector layer which supplies minority carriers to the drift layer, so that SiC-IGBT can be obtained. Since the additional SiC epitaxial growth layer 9 has an impurity concentration higher than that of the drift layer, tensile stress is generated to contribute to reduction of warpage of the SiC epitaxial substrate.

Figure 20:
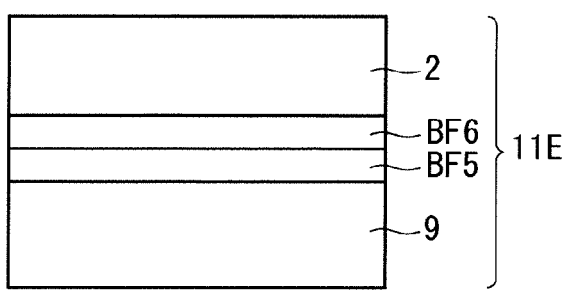
FIG. 20 is a sectional view showing a SiC epitaxial substrate provided with a buffer layer.

In the SiC epitaxial substrate 10E shown in FIG. 19, the additional SiC epitaxial growth layer 9 and the SiC epitaxial growth layer 2 are in direct contact with each other, but the SiC epitaxial substrate may be replaced by a SiC epitaxial substrate 11E in which a buffer layer BF5 of second-conductivity-type and a buffer layer BF6 of first-conductivity-type are provided between the additional SiC epitaxial growth layer 9 and the SiC epitaxial growth layer 2 as shown in FIG. 20. The buffer layer is a layer that reduces a lattice mismatch due to a difference in carrier concentration between the epitaxial layer and the substrate, and the thickness is set to about 0.5 to 10 μm (500 nm to 10000 nm).

(Embodiment 6)

While a SiC epitaxial substrate obtained by removing the SiC support substrate 1 mechanically or chemically or by other method is used in the method for manufacturing a semiconductor device in embodiment 4 described above, a SiC epitaxial substrate 10F in which as shown in FIG. 21, a SiC support substrate 1 is partially removed mechanically or chemically or by other method, so that the SiC support substrate has a thickness smaller than that of the SiC support substrate of the SiC epitaxial substrate 10 shown in FIG. 3 is used in the method for manufacturing a semiconductor device in embodiment 6 according to the present invention.

Thus, the method for manufacturing a semiconductor device in embodiment 6 according to the present invention further includes the step of partially removing the SiC support substrate 1 from the second main surface in addition to the method for manufacturing a semiconductor device in embodiment 1 described above. In this step, the thickness of the SiC support substrate 1 is set to about 20% to 70% of the thickness of the SiC epitaxial substrate 10. For example, when the thickness of the SiC support substrate 1 of the SiC epitaxial substrate 10 is 350 μm, the thickness of the SiC support substrate 1 of the SiC epitaxial substrate 10F is 70

μm to 250 μm. By thinning the SiC support substrate 1 as described above, such an effect is obtained that the on-resistance and the heat resistance can be reduced, and variations in on-resistance and heat resistance of the SiC support substrate 1 decrease when SiC-MOSFET or SiC-IGBT is prepared.

The step of partially removing the SiC support substrate 1 from the second main surface corresponds to, for example, thinning of the semiconductor device. In the SiC epitaxial substrate 10F subjected to thinning, large warpage occurs due to stress caused by a work-affected layer formed on a surface from which the SiC support substrate 1 is removed.

For the SiC epitaxial substrate 10F in which large warpage occurs as described above, ion implantation for controlling warpage is applied to the surface from which the SiC support substrate 1 is removed. This reduces stress caused by the work-affected layer formed on the surface from which the SiC support substrate 1 is removed, so that warpage becomes smaller as compared to that of the SiC epitaxial substrate 10F.

In the method for manufacturing a semiconductor device according to embodiment 6 as described above, warpage of the SiC epitaxial substrate 10F, which is caused by partially removing the SiC support substrate 1 from the second main surface, can be controlled by ion implantation applied to the surface from which the SiC support substrate 1 is removed, and therefore an almost flat SiC epitaxial substrate is obtained. Accordingly, the SiC epitaxial substrate is not cracked, and thus a SiC semiconductor device can be stably manufactured.

With the SiC epitaxial substrate 10F, both semiconductor devices: SiC-MOSFET and SiC-IGBT can be prepared.

In embodiment 6, an additional SiC epitaxial growth layer 7 of first-conductivity-type may be further formed on the SiC epitaxial growth layer 2 as in the case of embodiment 2.

(Modification)

In embodiments 1 to 6 described above, the well region 3, the source region 4 and the well contact region 5 are formed by the ion implantation process, but a part or all of the regions may be formed using epitaxial growth and etching technique.

For example, a part of the drift layer may be etched, followed by epitaxially growing a layer having a conductivity-type opposite to that of the drift layer, and removing an unnecessary epitaxial growth layer by chemical-mechanical polishing (CMP) etc. to form the above-mentioned impurity regions. Semiconductor devices having impurity regions formed by epitaxial growth include IEMOS (Implantation and Epitaxial MOSFET).

(Other Application Examples)

Embodiments 1 to 6 have been described above taking a method for manufacturing SiC-MOSFET or SiC-IGBT as an example, but the present invention can also be applied to manufacturing of SiC semiconductor elements such as SBD (Schottky Barrier Diode), PiN (P-intrinsic-N) diodes, JFET (Junction FET), thyristors, GTO (Gate Turn-Off Thyristor) and BJT (Bipolar Junction Transistor).

The crystal-type and conductivity type of SiC, and suitable ranges of values of specific thicknesses of the layers, and depths and impurity concentrations of impurity regions are well known to a person skilled in the art, and the values described in embodiments 1 to 5 of the present invention can be appropriately changed.

The present invention has been described in detail, but the above descriptions are illustrative in all aspects, and the present invention is not limited thereto. It is understood that an infinite number of modifications that are not illustrated can be conceived without departing from the scope of the present invention.

In the present invention, the embodiments can be freely combined, or the embodiments can be appropriately modified and omitted within the scope of the present invention.

The invention claimed is:

1. A method for manufacturing a semiconductor device, comprising the steps of:
   (a) preparing a SiC epitaxial substrate in which on a SiC support substrate, a SiC epitaxial growth layer having an impurity concentration equal to or less than 1/10,000 of that of said SiC support substrate and having a thickness of 50 μm or more is disposed;
   (b) forming an impurity region which forms a semiconductor element by selectively implanting impurity ions to a first main surface of said SiC epitaxial substrate;
   (c) forming an ion implantation region which controls warpage of said SiC epitaxial substrate by implanting predetermined ions to a second main surface of said SiC epitaxial substrate; and
   (d) heating said SiC epitaxial substrate after said step (b) and said step (c).

2. The method for manufacturing a semiconductor device according to claim 1, further comprising the step of:
   removing said SiC support substrate of said SiC epitaxial substrate between said step (a) and said step (b), wherein
   one main surface of said SiC epitaxial growth layer is said first main surface of said SiC epitaxial substrate, and another main surface of said SiC epitaxial growth layer is said second main surface of said SiC epitaxial substrate.

3. The method for manufacturing a semiconductor device according to claim 1, further comprising the step of
   partially removing said SiC support substrate of said SiC epitaxial substrate from a side of said second main surface.

4. The method for manufacturing a semiconductor device according to claim 1, wherein
   said step (a) comprises the step of setting the impurity concentration of said SiC epitaxial growth layer within a range of $1\times10^{13}$ cm$^{-3}$ to $1\times10^{16}$ cm$^{-3}$.

5. The method for manufacturing a semiconductor device according to claim 1, wherein
   said step (c) comprises the step of injecting said predetermined ions at an implantation surface density of $1\times10^{13}$ cm$^{-2}$ to $1\times10^{16}$ cm$^{-2}$.

6. The method for manufacturing a semiconductor device according to claim 1, wherein
   said step (c) comprises the step of injecting said predetermined ions to said second main surface of said SiC epitaxial substrate in such a manner as to form a geometric shape as a shape in plan view.

7. The method for manufacturing a semiconductor device according to claim 1, wherein
   said step (c) comprises the step of selecting said predetermined ions from ions of carbon, silicon, hydrogen, helium, argon, aluminum, boron, phosphorus, nitrogen, nickel, and germanium.

8. The method for manufacturing a semiconductor device according to claim 1, wherein
   said step (c) comprising the step of making difference on an impurity concentration or a depth of said ion implantation region between an inner peripheral region within a predetermined distance from the center of said SiC epitaxial substrate and an outer peripheral region that is a region other than the inner peripheral region.

9. The method for manufacturing a semiconductor device according to claim 1, wherein
said step (d) comprises the step of heating said SiC epitaxial substrate at 1400° C. to 1800° C.

10. The method for manufacturing a semiconductor device according to claim 1, wherein
said step (a) comprises the step of forming an additional SiC epitaxial growth layer on said SiC epitaxial growth layer after forming said SiC epitaxial growth layer on said SiC support substrate, and
an exposed main surface of said additional SiC epitaxial growth layer is said first main surface of said SiC epitaxial substrate.

11. A semiconductor device manufactured using the method for manufacturing a semiconductor device according to claim 7, wherein
said SiC support substrate includes a region in which any of atoms of carbon, silicon, hydrogen, helium, argon, aluminum, boron, phosphorus, nitrogen, nickel and germanium is ion-implanted at an implantation surface density of $1\times10^{13}$ cm$^{-2}$ to $1\times10^{16}$ cm$^{-2}$.

\* \* \* \* \*